United States Patent
Chowdhury et al.

(10) Patent No.: US 11,631,972 B2
(45) Date of Patent: Apr. 18, 2023

(54) ACCURATE MODELING OF EQUIPMENT OVEREXCITATION DAMAGE CURVES

(71) Applicant: Schweitzer Engineering Laboratories, Inc., Pullman, WA (US)

(72) Inventors: Ritwik Chowdhury, Charlotte, NC (US); Dale S. Finney, Little Bras D'or (CA); Normann Fischer, Colfax, WA (US); Matchyaraju Alla, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 177 days.

(21) Appl. No.: 17/123,450

(22) Filed: Dec. 16, 2020

(65) Prior Publication Data
US 2022/0190581 A1    Jun. 16, 2022

(51) Int. Cl.
*G01R 31/34* (2020.01)
*H02H 1/00* (2006.01)
*G05B 19/042* (2006.01)
*H02H 7/04* (2006.01)
*G01R 31/62* (2020.01)

(52) U.S. Cl.
CPC .......... *H02H 1/0092* (2013.01); *G01R 31/34* (2013.01); *G01R 31/62* (2020.01); *G05B 19/0428* (2013.01); *H02H 7/04* (2013.01); *G05B 2219/24132* (2013.01); *G05B 2219/25257* (2013.01)

(58) Field of Classification Search
CPC ...... G01R 31/34; G01R 31/346; G01R 31/62; H02H 7/04; H02H 7/045; H02H 7/06; H02H 7/08; H02H 7/0844; H02H 1/0092; H02H 1/046; H02H 1/0007; H02H 1/0023
See application file for complete search history.

(56) References Cited

U.S. PATENT DOCUMENTS

| | | |
|---|---|---|
| 2,881,319 A | 4/1959 | Sills |
| 3,727,123 A | 4/1973 | Smith |
| 3,973,171 A | 8/1976 | Howell |
| 4,000,464 A | 12/1976 | Nussel |
| 4,001,646 A | 1/1977 | Howell |
| 4,029,951 A | 6/1977 | Berry |
| 4,066,950 A | 1/1978 | Rumold |
| 4,088,935 A | 5/1978 | D'Atre |

(Continued)

*Primary Examiner* — Nguyen Tran
(74) *Attorney, Agent, or Firm* — Jared L. Cherry; Richard M. Edge (57) ABSTRACT

The present disclosure relates to systems and methods for protecting against and mitigating the effects of over-excitation of elements in electric power systems. In one embodiment, a system consistent with the present disclosure may comprise a point pair subsystem to receive a plurality of point pairs that define an over-excitation curve for a piece of monitored equipment. The system may receive a plurality of measurements corresponding to electrical conditions associated with the piece of monitored equipment. A logarithmic interpolation subsystem may determine a logarithmic interpolation corresponding to one of the plurality of measurements based on the plurality of point pairs. An over-excitation detection subsystem may detect an over-excitation condition based on the logarithmic interpolation, and a protective action subsystem may implement a protective action based on the over-excitation condition.

22 Claims, 5 Drawing Sheets

(56) References Cited

U.S. PATENT DOCUMENTS

| | | |
|---|---|---|
| 4,148,087 A | 4/1979 | Phadke |
| 4,156,186 A | 5/1979 | Wolfinger |
| 4,159,499 A | 6/1979 | Breskin |
| 4,161,011 A | 7/1979 | Wilkinson |
| 4,206,398 A | 6/1980 | Janning |
| 4,245,182 A | 1/1981 | Aotsu |
| 4,321,643 A | 3/1982 | Vernier |
| 4,371,832 A | 2/1983 | Wilson |
| 4,511,811 A | 4/1985 | Gupta |
| 4,542,468 A | 9/1985 | Taniguti |
| 4,556,946 A | 12/1985 | Taniguti |
| 4,558,309 A | 12/1985 | Antonevich |
| 4,667,263 A | 5/1987 | Morris |
| 4,763,057 A | 8/1988 | Danz |
| 4,820,991 A | 4/1989 | Clark |
| 4,825,327 A | 4/1989 | Alexander |
| 4,851,758 A | 7/1989 | Ostada |
| 4,939,506 A | 7/1990 | Gram |
| 4,982,147 A | 1/1991 | Lauw |
| 5,057,962 A | 10/1991 | Alley |
| 5,252,915 A | 10/1993 | Sedding |
| 5,264,778 A | 11/1993 | Kimmel |
| 5,363,047 A | 11/1994 | Dresti |
| 5,365,396 A | 11/1994 | Roberts |
| 5,471,880 A | 12/1995 | Lang |
| 5,508,620 A | 4/1996 | Pfiffner |
| 5,514,963 A | 5/1996 | Korbmacher |
| 5,519,300 A | 5/1996 | Leon |
| 5,581,470 A | 12/1996 | Pawloski |
| 5,592,393 A | 1/1997 | Yalla |
| 5,633,550 A | 5/1997 | Meehan |
| 5,675,465 A | 10/1997 | Tanaka |
| 5,739,693 A | 4/1998 | Pfiffner |
| 5,764,462 A | 6/1998 | Tanaka |
| 5,805,395 A | 9/1998 | Hu |
| 5,933,306 A | 8/1999 | Santos |
| 5,963,404 A | 10/1999 | Guzman-Casillas |
| 5,982,595 A | 11/1999 | Pozzuoli |
| 6,121,886 A | 9/2000 | Anderson |
| 6,137,187 A | 10/2000 | Mikhail |
| 6,169,489 B1 | 1/2001 | Kliman |
| 6,262,550 B1 | 7/2001 | Kliman |
| 6,294,898 B2 | 9/2001 | Lawson |
| 6,396,284 B1 | 5/2002 | Tisdale |
| 6,426,632 B1 | 7/2002 | Clunn |
| 6,459,269 B1 | 10/2002 | Jones |
| 6,492,801 B1 | 12/2002 | Sims |
| 6,496,757 B1 | 12/2002 | Flueck |
| 6,525,504 B1 | 2/2003 | Nygren |
| 6,714,020 B2 | 3/2004 | Hobelsberger |
| 6,721,671 B2 | 4/2004 | Roberts |
| 6,794,879 B2 | 9/2004 | Lawson |
| 6,794,883 B2 | 9/2004 | Klingel |
| 6,815,932 B2 | 11/2004 | Wall |
| 6,839,207 B2 | 1/2005 | Falliot |
| 6,924,565 B2 | 8/2005 | Wilkins |
| 6,924,628 B2 | 8/2005 | Thompson |
| 6,975,946 B2 | 12/2005 | Al-Hamrani |
| 6,992,490 B2 | 1/2006 | Nomoto |
| 7,006,935 B2 | 2/2006 | Seki |
| 7,253,634 B1 | 8/2007 | Kasztenny |
| 7,304,403 B2 | 12/2007 | Xu |
| 7,498,818 B2 | 3/2009 | Benmouyal |
| 7,528,611 B2 | 5/2009 | Kasztenny |
| 7,532,010 B2 | 5/2009 | Kamel |
| 7,592,772 B2 | 9/2009 | Nandi |
| 7,693,607 B2 | 4/2010 | Kasztenny |
| 7,710,693 B2 | 5/2010 | Guzman-Casillas |
| 7,804,303 B2 | 9/2010 | Benmouyal |
| 8,405,940 B2 | 3/2013 | Schweitzer |
| 8,823,307 B2 | 9/2014 | Gajic |
| 9,496,707 B2 | 11/2016 | Thompson |
| 10,333,291 B2 | 6/2019 | Chowdhury |
| 10,819,261 B1 | 10/2020 | Chowdhury |
| 2001/0001534 A1 | 5/2001 | Lawson |
| 2002/0128759 A1 | 9/2002 | Sodoski |
| 2002/0140433 A1 | 10/2002 | Lawson |
| 2003/0085715 A1 | 5/2003 | Lubkeman |
| 2005/0033481 A1 | 2/2005 | Budhraja |
| 2006/0125486 A1 | 6/2006 | Premerlani |
| 2006/0146469 A1* | 7/2006 | Heagerty ............... H04Q 9/00 |
| | | 361/115 |
| 2007/0085549 A1 | 4/2007 | Fischer |
| 2008/0074810 A1* | 3/2008 | Guzman-Casillas .. H02H 7/065 |
| | | 361/20 |
| 2009/0039655 A1 | 2/2009 | Berchowitz |
| 2009/0160454 A1 | 6/2009 | Johansson |
| 2009/0219030 A1 | 9/2009 | Salem |
| 2009/0254297 A1 | 10/2009 | Bengtsson |
| 2010/0194324 A1 | 8/2010 | Kasztenny |
| 2011/0085272 A1 | 4/2011 | Schweitzer |
| 2011/0158786 A1 | 6/2011 | Molitor |
| 2012/0112758 A1 | 5/2012 | Weems |
| 2013/0300209 A1 | 11/2013 | Long |
| 2015/0051852 A1 | 2/2015 | Pan |
| 2015/0222122 A1 | 8/2015 | Nuqui |
| 2016/0025811 A1 | 1/2016 | Kasztenny |
| 2016/0042899 A1* | 2/2016 | Zhou ..................... H01H 47/22 |
| | | 361/160 |
| 2016/0049891 A1 | 2/2016 | Frampton |
| 2016/0181790 A1 | 6/2016 | Thompson |
| 2019/0049490 A1* | 2/2019 | Takemura ......... G01R 19/2509 |
| 2019/0097417 A1 | 3/2019 | Chowdhury |

\* cited by examiner

Figure 5

ACCURATE MODELING OF EQUIPMENT OVEREXCITATION DAMAGE CURVES

TECHNICAL FIELD

This disclosure relates to systems and methods for accurately implementing over-excitation damage curves in electric power system modeling. More specifically but not exclusively, the present disclosure relates to modeling generator and transformer over-excitation using logarithmic interpolation based on data values provided by equipment manufacturers.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric power systems are used to generate, transmit, and distribute electric power to loads, and serve as an important part of critical infrastructure. Electric power systems and equipment may be monitored and protected by a variety of types of equipment. Protective relays may analyze the parameters of the electric power system to implement protection functions. The primary protective relays may communicate with various other supervisory devices such as automation systems, monitoring systems, supervisory (SCADA) systems, and other intelligent electronic devices (IEDs). IEDs may collect data from various devices within an electric power system and monitor, control, automate, and/or protect such devices. For example, IEDs associated with generators and transformers may monitor electrical parameters to ensure that the equipment does not operate in an over-excitation condition.

Over-excitation is a phenomenon that can occur in any magnetic device but is of greatest concern for power transformers and generators. Over-excitation causes magnetic saturation. Iron is commonly used in generators and transformers, and one physical property of iron is the flux it can support per cross-sectional area or flux density. When the maximum flux density is reached, the iron becomes saturated, meaning that the iron cannot support more flux per cross-sectional area. Once saturation is reached, excess flux travels via alternate paths. Excess flux traveling via alternative paths will induce circulating currents, known as eddy currents in nonlaminated components that are not designed to carry flux and may generate heat.

The magnitude of the eddy currents induced in a generator core are proportional to the cross-sectional area of the flux path. In a generator, the flux travels in a radial direction (i.e., parallel to the generator core laminations) under normal conditions. Stator and transformer cores are commonly formed with laminated sheets of iron separated by sheets of insulation to reduce losses due to eddy currents.

When a generator core is saturated, flux no longer flows parallel to the laminations but begins to flow perpendicular to the laminations which gives rise to eddy currents within the core, as the magnitude of the flux flowing perpendicular to the stator core increase the eddy currents become larger, the eddy current are proportional to the flux flowing perpendicular to the laminations. This condition leads to voltage gradients between the laminations. These gradients can result in the breakdown of the interlaminar insulation, resulting in permanent damage. Depending on the conditions, damage can begin to occur in a matter of seconds. Another effect of the saturated core is that the flux begins to flow into nonlaminated portions of the generator, such as the core ends. During normal operation, the core permeability is high compared to the core ends. When the core is saturated, its permeability significantly decreases, resulting in flux flowing axially (perpendicular to the laminations) through the ends of the core, which and inducing eddy currents that cause heating of the end core. The heating resulting from over-excitation demonstrates exponential behavior.

It is difficult to measure the amount of flux in the core, but the amount of flux in the stator core can be monitored in various ways, including the techniques disclosed in U.S. Pat. No. 10,578,653, which is incorporated herein by reference. Equipment manufacturers commonly provide over-excitation curves that identify prohibited regions of operation corresponding to over-excitation. A user may rely on such curves to appropriately configure an IED to prevent the equipment from operating in the prohibited region. The form and quantity of information provided by equipment manufacturers vary. A user commissioning the equipment may therefore be required to input information about the prohibited regions of operation. Users may provide such information in the form of point pairs that identify the boundary of the prohibited regions of operation. Protection systems and IEDs commonly use linear interpolation to fill in gaps between point pairs provided by a user.

The inventors of the present disclosure have recognized that the systems and methods disclosed herein may allow for IEDs to better avoid potential damage from over-excitation. In various embodiments, the over-excitation curves may be modeled logarithmically, and logarithmic interpolation may be used to fill in gaps between point pairs provided by a user. The inventors of the present disclosure have recognized that over-excitation damage curves for a transformer and generator may not be linear since the physical equipment includes components that have different tolerances and levels of susceptibility to over-excitation. Still further, equipment curves are typically provided using a semi-log plot and since relays generally do linear interpolation, that plot should be converted to a linear plot before selecting coordinate pairs. Even then, this conversion could introduce errors if not carried out properly.

As discussed below, there may be significant differences between element behavior determined using a logarithmic-based system and a linear-based system, particularly where a user relies on relatively few point pairs. The logarithmic-based systems and methods disclosed herein model the over-excitation curves more accurately, and thus, are better able to protect power system components from damage resulting from operation in a prohibited region of operation.

As used herein, an IED may refer to any microprocessor-based device that monitors, controls, automates, and/or protects monitored equipment within a system. Such devices may include, for example, differential relays, distance relays, directional relays, feeder relays, overcurrent relays, voltage regulator controls, voltage relays, breaker failure relays, generator relays, motor relays, remote terminal units, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. Further, IEDs may include sensors (e.g., voltage transformers, current transformers, contact sensors, status sensors, light sensors, tension sensors, etc.) that provide information about the electric power system.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

Figure 1:
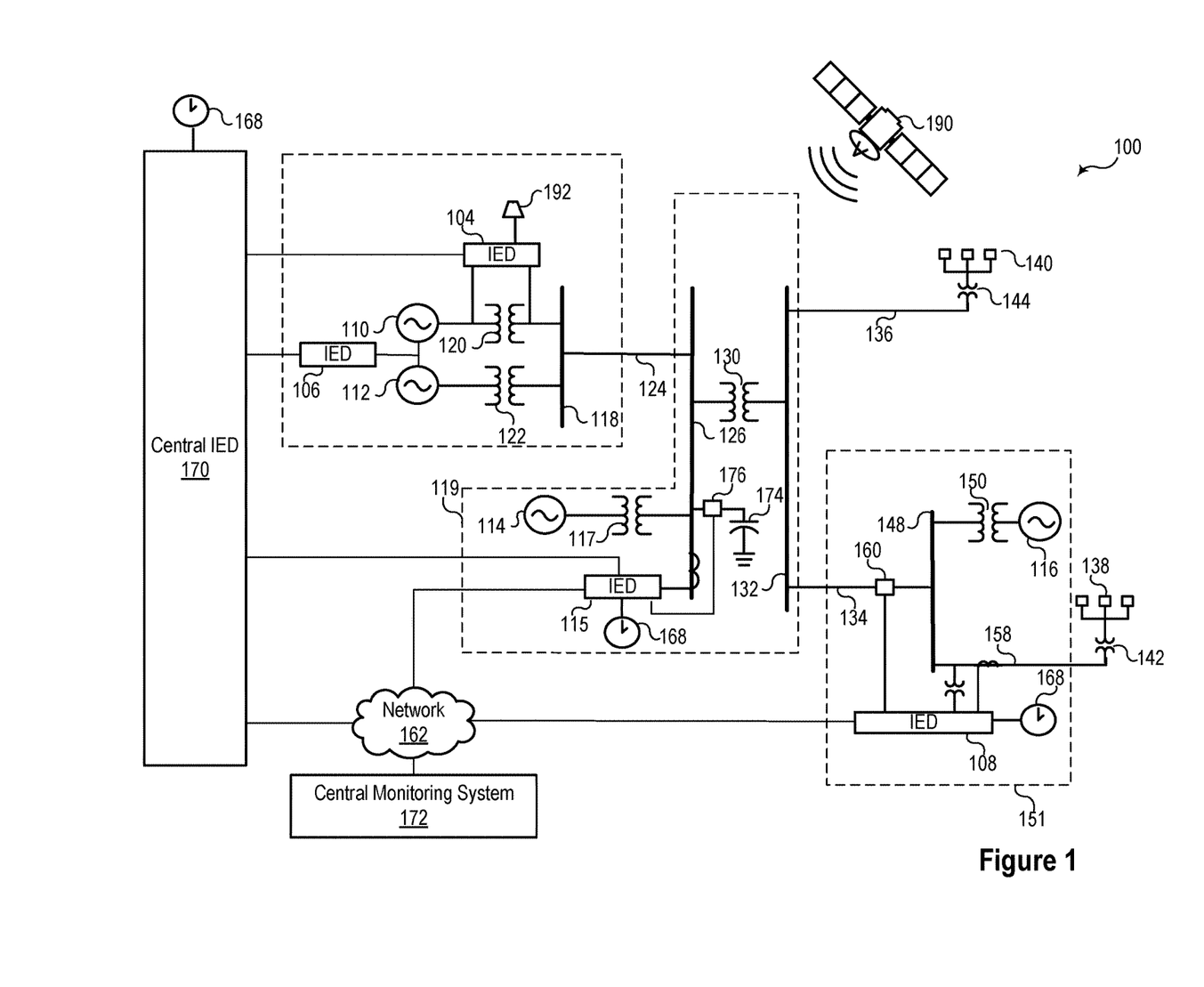
FIG. 1 illustrates a simplified one-line diagram of an electrical power delivery system consistent with embodiments of the present disclosure.

FIG. 1 illustrates a simplified one-line diagram of an electrical power delivery system 100 consistent with embodiments of the present disclosure. Electrical power delivery system 100 may be configured to generate, transmit, and distribute electrical energy to loads. Electrical power delivery systems may include equipment such as electrical generators (e.g., generators 110, 112, 114, and 116), power transformers (e.g., transformers 117, 120, 122, 130, 142, 144, and 150), power transmission and delivery lines (e.g., lines 124, 134, 136, and 158), circuit breakers (e.g., breakers 160, 176), busses (e.g., busses 118, 126, 132, and 148), loads (e.g., loads 140 and 138) and the like. A variety of other types of equipment may also be included in electrical power delivery system 100, such as voltage regulators, capacitor banks, and the like.

Substation 119 may include a generator 114, which may be a distributed energy resource, and which may be connected to bus 126 through step-up transformer 117. Bus 126 may be connected to a distribution bus 132 via a step-down transformer 130. Various distribution lines 136 and 134 may be connected to distribution bus 132. Load 140 may be fed from distribution line 136. Further, step-down transformer 144 connected to distribution bus 132 via distribution line 136 may be used to step down a voltage for consumption by load 140.

Distribution line 134 may lead to substation 151 and deliver electrical power to bus 148. Bus 148 may also receive electrical power from distributed energy resource 116 via transformer 150. Distribution line 158 may deliver electrical power from bus 148 to load 138 and may include further step-down transformer 142. Circuit breaker 160 may be used to selectively connect bus 148 to distribution line 134. IED 108 may be used to monitor and/or control circuit breaker 160 as well as distribution line 158.

Electrical power delivery system 100 may be monitored, controlled, automated, and/or protected using IEDs, such as IEDs 104, 106, 108, 115, and 170, and a central monitoring system 172. In general, IEDs in an electrical power generation and transmission system may be used for protection, control, automation, and/or monitoring of equipment in the system. For example, IEDs may be used to monitor equipment of many types, including electrical transmission lines, electrical distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

Central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108, and 115 may be remote from the central IED 170 and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

A common time signal 168 may be used to time-align measurements for comparison and/or synchronize action across system 100. Utilizing a common or universal time source may ensure that IEDs have a synchronized time signal that can be used to generate time-synchronized data, such as synchrophasors. In various embodiments, the common time source may comprise a time signal from a GNSS system 190. IED 104 may include a receiver 192 configured to receive the common time signal 168 from the GNSS system 190. In various embodiments, IED 106 may be configured to distribute the common time signal 168 to other components in system 100, such as IEDs 104, 108, 115, and 170.

In various embodiments, sensors may be utilized in system 100 to measure electrical parameters in system 100. Such measurements may be utilized by various control systems to implement control actions in system 100. In one specific embodiment, system 100 may measure the degree to which the voltage of the power system is out of phase with the current of the system. Reactive power support may be provided by selectively connecting a capacitor bank 174 to system 100 using a breaker 176.

IED 106 may monitor, automate, protect, and/or control generators 110 and 112. Among other things, IED 106 may ensure that generators 110 and 112 do not operate in a prohibited region defined by an over-excitation curve. If an over-excitation condition is detected, IED 106 may correct the condition by reducing the excitation or by interrupting the operation of generators 110 and 112. According to IEEE Standard C50.13, a generator must be rated for 105% of the generator base, while IEEE Standard C57.12 gives two ratings for transformers: 1.05% at rated load and 0.8 power factor or greater as well as 110% at no load, both on the transformer secondary base.

Figure 2:
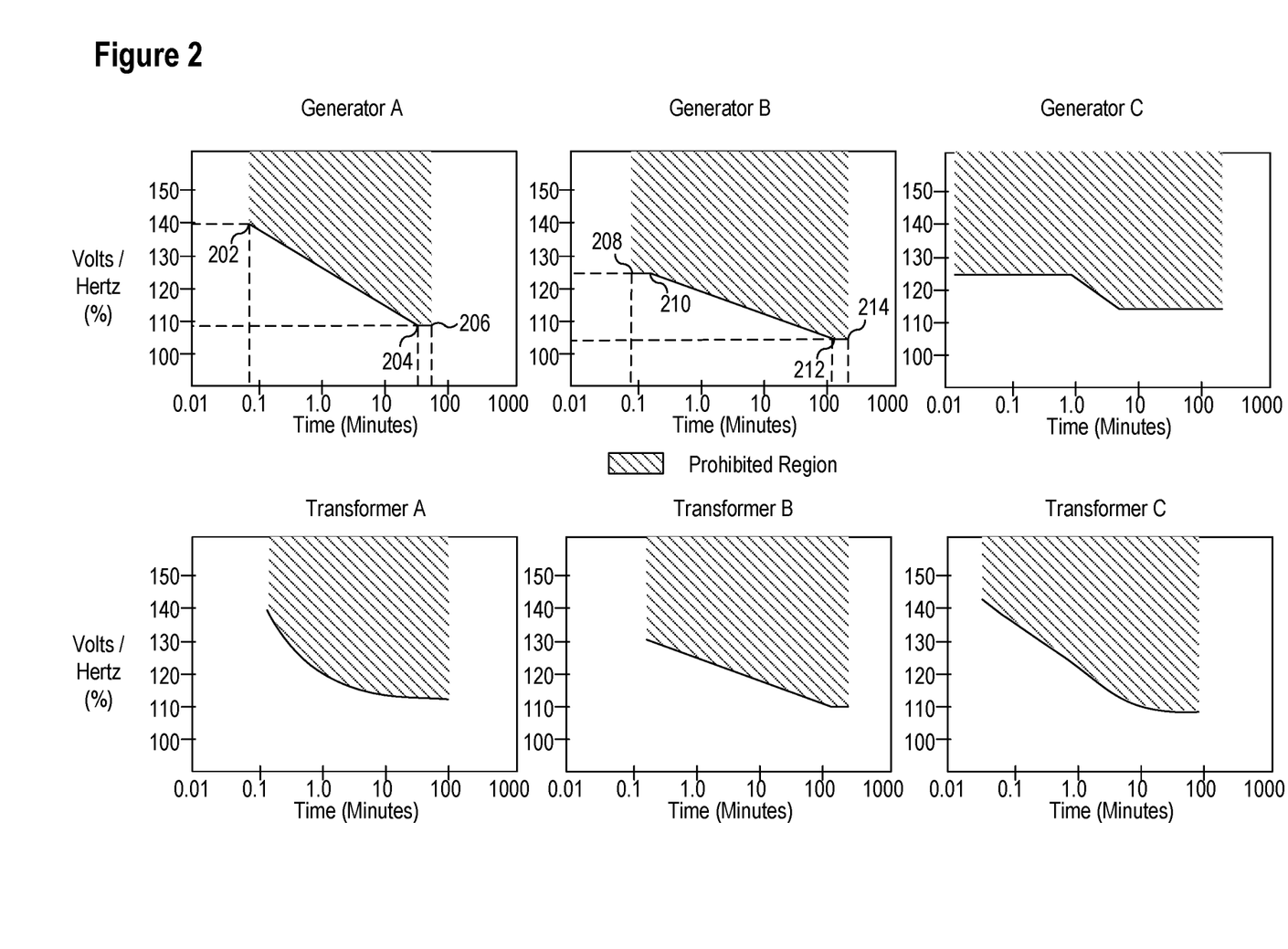
FIG. 2 illustrates representative over-excitation curves for a plurality of generators and a plurality of transformers consistent with embodiments of the present disclosure.

FIG. 2 illustrates representative over-excitation curves for a plurality of generators and a plurality of transformers consistent with embodiments of the present disclosure. The approximately linear features of certain over-excitation curves may cause users to inaccurately conclude that a small number of point pairs will accurately reflect the response of the systems; however, the plots are shown on a semi-log plot, with a logarithmic scale on the x-axis and a linear scale on the y-axis. The use of a semi-log plot implies that the operate-time of the relay is an exponential function with respect to the Volts per Hertz plotted on the y-axis.

The over-excitation curves of Generator A, Generator B, and Generator C each comprise approximately linear segments that may be defined as piecewise functions. For example, the over-excitation curve of generator A includes two approximately linear sections on the semi-log plot that can be defined by a piecewise function based on the point pairs identified by reference numbers 202, 204, and 206, with point pair 202 at about 0.85 minutes and 138%, point pair 204 at 60 minutes and 108%, and point pair 206 at 80 minutes and 108%. Similarly, the over-excitation curve of generator B may be defined by the point pairs identified by reference numbers 208, 210, 212, and 214, with point pair 208 at about 0.09 minutes and 124%, point pair 210 at about 0.2 minutes at 124%, point pair 212 at about 105 minutes and 104%, and point pair 214 at about 200 minutes and 104%. Despite the linear representation of the semi-log plots, the over-excitation curves represent exponential functions.

The over-excitation curves of Transformer A and Transformer C include non-linear sections that may require the entry of significantly more point pairs in comparison to the over-excitation curve of Generators A-C to accurately represent the curves. Some equipment manufacturers may provide 20, 30, or more point pairs that may be used; however, a user may ultimately determine how many point pairs to utilize. Users may err on the side of using relatively few point pairs, which, as explained below, can lead to significant errors in linear-based systems. Furthermore, requesting a user to provide more points increases the probability of a user error because such points are typically entered manually.

Figure 3A:
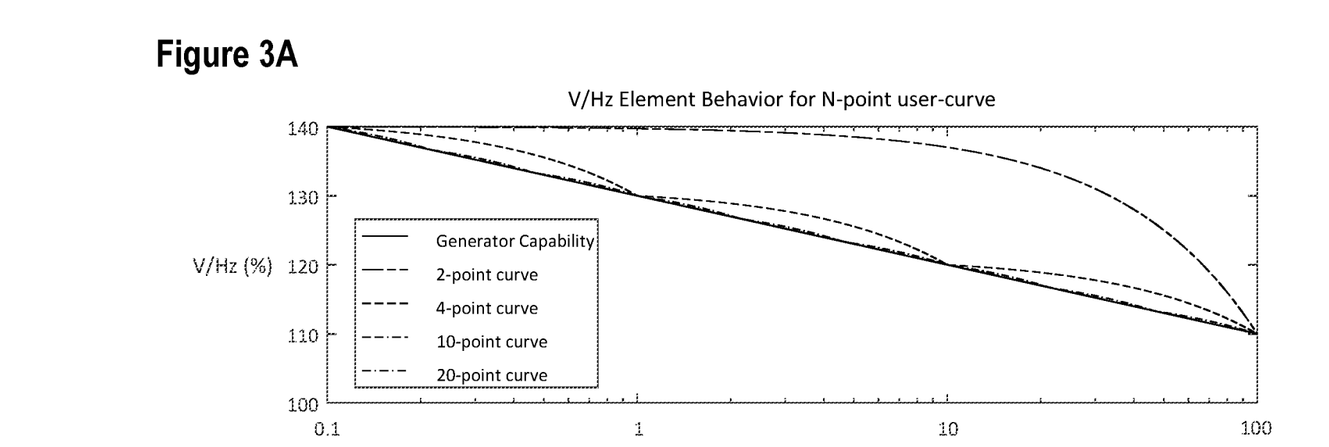
FIG. 3A illustrates a plot comparing a generator capability to predicted behavior using a linear-based system relying on varying numbers of point pairs.

FIG. 3A illustrates a plot comparing a generator capability to predicted behavior using a linear-based system relying on varying numbers of point pairs. The generator capability is a straight line extending from 0.1 minutes at 140% to 100 minutes at 110%. The appearance of the generator capability as a straight line may cause a user to incorrectly conclude that the curve may be accurately represented by two point pairs since two points are all that is needed to describe a line. As illustrated by the 2-point curve, however, there is a significant difference between the element behavior using a 2-point curve and the generator capability.

As illustrated in FIG. 3A, increasing the number of point pairs reduces the discrepancy between the generator capability and the predicted element behavior. As the number of point pairs used to represent the element increases, the behavior of the element predicted by the linear-based model more closely approximates the actual generator capability.

Figure 3B:
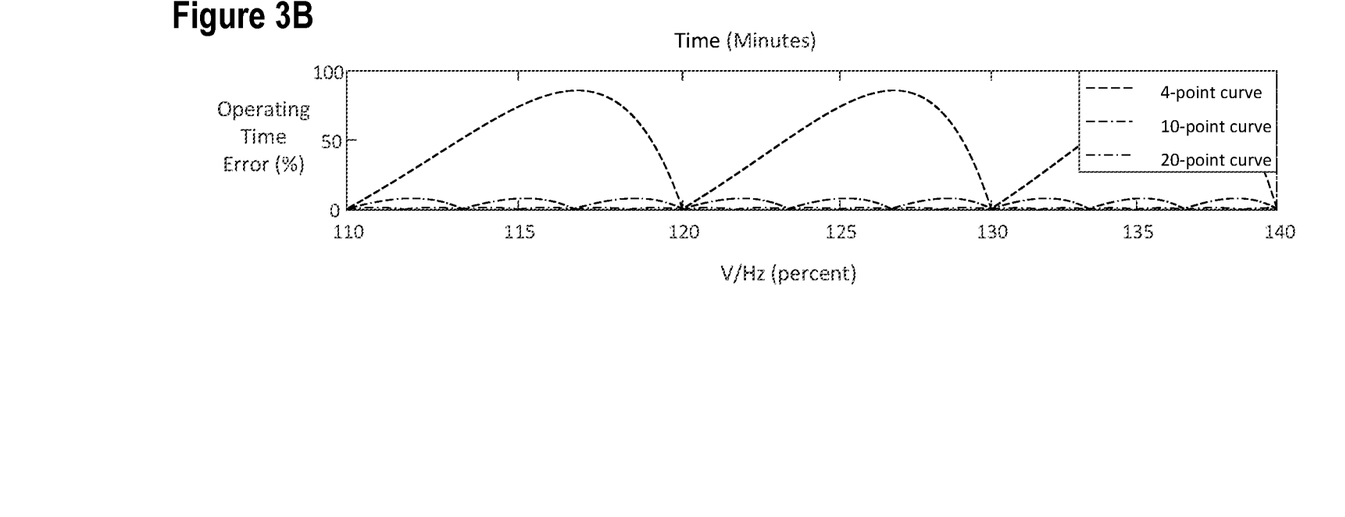
FIG. 3B illustrates a plot comparing an operating time error of a protective relay using a linear-based system relying on varying numbers of point pairs.

FIG. 3B illustrates a plot comparing an operating time error of a protective relay using a linear-based system relying on varying numbers of point pairs. As illustrated in FIG. 3B, the operating time error of a relay increases as the number of point pairs decreases. The maximum operating error based on four point pairs is 85.7%, the maximum error based on ten point pairs is 7.6%, and the maximum error based on twenty point pairs is 1.7%. Stated in other terms, if an operator uses four point pairs to approximate an over-excitation damage curve, there is a potential for an IED protecting the generator to operate 85.7% slower than the operator anticipates. If only two point pairs are used to approximate the damages curve, a condition that should trigger a protective action in 1 second may take as long as 52.569 seconds.

The significant operating time errors shown in FIG. 3B may be reduced by using a logarithmic-based system consistent with the present disclosure rather than a linear-based system. While the error decreases with an increase in the number of point pairs provided by a user, the error is attributable to the underlying assumption that the system behaves linearly and that linear interpolation between point pairs will yield an accurate approximation.

Exponential interpolation between point pairs may be used by systems and methods consistent with the present disclosure to determine when equipment is operating in a prohibited region due to over-excitation. In some embodiments, base-10 representations may be used for ease of implementation and demonstration since over-excitation curves are commonly provided in base-10. Conversion from base-10 representation may be performed using Eq. 1.

$$10^x = e^{x\left(\frac{log_{10}(10)}{log_{10}(e)}\right)} \qquad \text{Eq. 1}$$

For the plot shown in FIG. 3A, an operating time for a given V/Hz based on generator capability may be calculated using Eq. 2.

$$t = 0.1 \cdot 10^{\left(\frac{140-VHz}{10}\right)} \qquad \text{Eq. 2}$$

Of course, other embodiments may be configured to use another base (e.g., $e^x$) or any other number (e.g., $2^x$).

In systems and methods consistent with the present disclosure, a user may provide two points ($VHz_1$, $t_1$) and ($VHz_2$, $t_2$) for each piecewise segment of an over-excitation curve. The slope between these two points may be determined using Eq. 3. To obtain computational efficiency, the slope may be calculated by the relay once when the points are provided.

$$\text{Slope} = \frac{VHz_1 - VHz_2}{10 \cdot \log_{10}\left(\frac{t_2}{t_1}\right)} \qquad \text{Eq. 3}$$

The slope calculated using Eq. 3 may be used to interpolate an operating time, t, for a measured value, VHz, that is between $VHz_1$ and $VHz_2$ using Eq. 4.

$$t = t_1 \cdot 10^{\left(\frac{VHz_1 - VHz}{Slope * 10}\right)} \qquad \text{Eq. 4}$$

Eq. 3 and Eq. 4 may provide a linear interpolation based on a measured condition between the points ($VHz_1$, $t_1$) and ($VHz_2$, $t_2$). Using this interpolation, the operating time, t, may be determined before damage occurs to monitored equipment due to an over-excitation condition. Accordingly, in some embodiments the operating time, t, may be allowed to elapse before a protective action is implemented.

For example, referring to the over-excitation curve of Generator A illustrated in FIG. 2, two approximately linear sections on the semi-log plot can be defined by a piecewise function based on the point pairs identified by reference numbers 202, 204, and 206, with point pair 202 at about 0.85 minutes and 138%, point pair 204 at 60 minutes and 108%, and point pair 206 at 80 minutes and 108%. Accordingly, the over-excitation curve of Generator A may be defined using systems and methods consistent with the present disclosure using the point pairs identified by reference numbers 202, 204, and 206.

In some embodiments, the Taylor series expansion of 10 to the power of x may be used to define Eq. 4. The Taylor series expansion of $10^x$ is shown in Eq. 5. The Taylor series expansion may be more efficient in calculating $10^x$ in some embodiments.

$$10^x = \sum_{n=0}^{N} \frac{x^n \cdot \ln^n(10)}{n!} \qquad \text{Eq. 5}$$

In some embodiments, alternative approaches to perform logarithmic interpolation may use used. Eq. 6 may be used to calculate a fractional part, f, of the operating point relative to the boundary points provided by the user for a measured value, VHz.

$$f = \frac{VHz - VHz_1}{VHz_2 - VHz_1} \qquad \text{Eq. 6}$$

Thereafter, Eq. 7 may use the fractional part, f, to interpolate an operating time, t.

$$t = t_2^f \cdot t_1^{(1-f)} \qquad \text{Eq. 7}$$

Eq. 6 and Eq. 7 are alternatives to Eq. 3 and Eq. 4; other alternatives exist.

Figure 4:
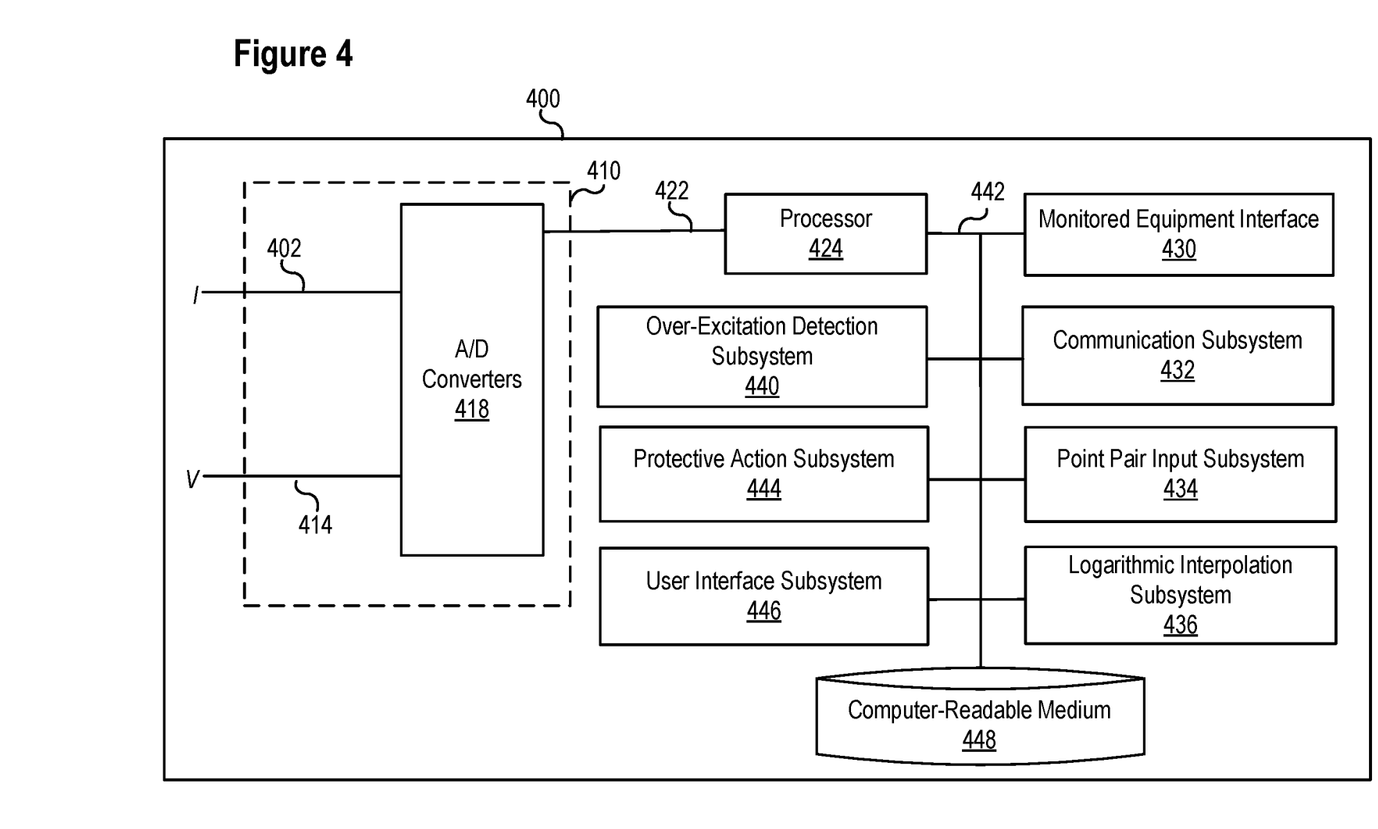
FIG. 4 illustrates a functional block diagram of a system to protect equipment in an electric power system from over-excitation consistent with embodiments of the present disclosure.

FIG. 4 illustrates a functional block diagram of a system 400 to protect equipment in an electric power system from over-excitation consistent with embodiments of the present disclosure. System 400 may be implemented using hardware, software, firmware, and/or any combination thereof. In some embodiments, system 400 may be embodied as an IED, while in other embodiments, certain components or functions described herein may be associated with other devices or performed by other devices. The specifically illustrated configuration is merely representative of one embodiment consistent with the present disclosure.

System 400 includes a communication subsystem 432 to communicate with devices and/or IEDs. In certain embodiments, communication subsystem 432 may facilitate direct communication with other IEDs or communicate with systems over a communications network. Measurements relating to electrical conditions and other information used by system 400 may be transmitted via communication subsystem 432. Further, measurements and information created by system 400 may be transmitted via communication subsystem 432 to other components.

A monitored equipment interface 430 may receive status information from, and issue control instructions to, a piece of monitored equipment (such as a generator, transformer, circuit breaker, or the like). Monitored equipment interface 430 may implement control actions upon the detection of an over-excitation condition. Such instructions may include changing an excitation of a generator or a transformer or disconnecting a generator or a transformer.

Processor 424 processes communications received via communication subsystem 432, monitored equipment interface 430, and the other subsystems and components in system 400. Processor 424 may operate using any number of processing rates and architectures. Processor 424 may perform various algorithms and calculations described herein.

Processor 424 may be embodied as a general-purpose integrated circuit, an application-specific integrated circuit, a field-programmable gate array, and/or any other suitable programmable logic device. Processor 424 may communicate with other elements in system 400 by way of bus 442.

Computer-readable medium 448 may comprise any of a variety of non-transitory computer-readable storage media. Computer-readable medium 448 may comprise executable instructions to perform processes described herein. Computer-readable medium 448 may comprise non-transitory machine-readable media such as, but not limited to, hard drives, removable media, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. Such electronic instructions may be executed on processor 424.

In certain embodiments, system 400 may include a sensor subsystem 410. In the illustrated embodiment, sensor subsystem 410 may receive current measurements 402 and/or voltage measurements 414. The sensor subsystem 410 may comprise A/D converters 418 that sample and/or digitize filtered waveforms to form corresponding digitized current and voltage signals provided to data bus 422. High-fidelity current measurements 402 and/or high-fidelity voltage measurements 414 may include separate signals from each phase of a three-phase electric power system. A/D converters 418 may be connected to processor 424 by way of data bus 422, through which digitized representations of current and voltage signals may be transmitted to processor 424. In some embodiments, transformers (not shown) may be used to reduce the current or voltage to a level suitable for analysis by system 400.

A point pair input subsystem 434 may facilitate user entry of point pairs associated with an over-excitation curve of a piece of monitored equipment (e.g., a generator, a transformer, etc.). In various embodiments, the point pairs may be entered by a user from information provided by an equipment manufacturer. In some cases, the point pairs may define a piecewise function.

A logarithmic interpolation subsystem 436 may be used to interpolate values corresponding to measured electrical conditions between point pairs. In various embodiments, the logarithmic interpolation subsystem 436 may utilize Eq. 3 to determine a slope at a given portion of an over-excitation curve and may utilize Eq. 4 to determine an operating time corresponding to the measured value.

An over-excitation detection subsystem 440 may utilize an interpolated value generated by logarithmic interpolation subsystem 436 to determine whether a piece of monitored equipment is operating in a prohibited region due to over-excitation.

Protective action subsystem 444 may implement a protective action to address an over-excitation condition detected by over-excitation detection subsystem 440. Protective actions may include reducing an excitation, shutting down, electrically isolating the monitored equipment, or making other adjustments to monitored equipment to address an over-excitation condition.

A user interface subsystem 446 may generate a user interface through which a user may provide the plurality of point pairs with a piece of monitored equipment. The user interface subsystem 446 may communicate the plurality of point pairs received from a user to the over-excitation detection subsystem 440 and the logarithmic interpolation subsystem 436 for use in implementing over-excitation protection. In various embodiments, the user interface subsystem 446 may receive the plurality of point pairs in a base-10 representation. System 400 may convert the base-10 representation to another base. Further, in some embodiments, the base-10 representation may be represented using a Taylor series expansion using Eq. 5.

Figure 5:
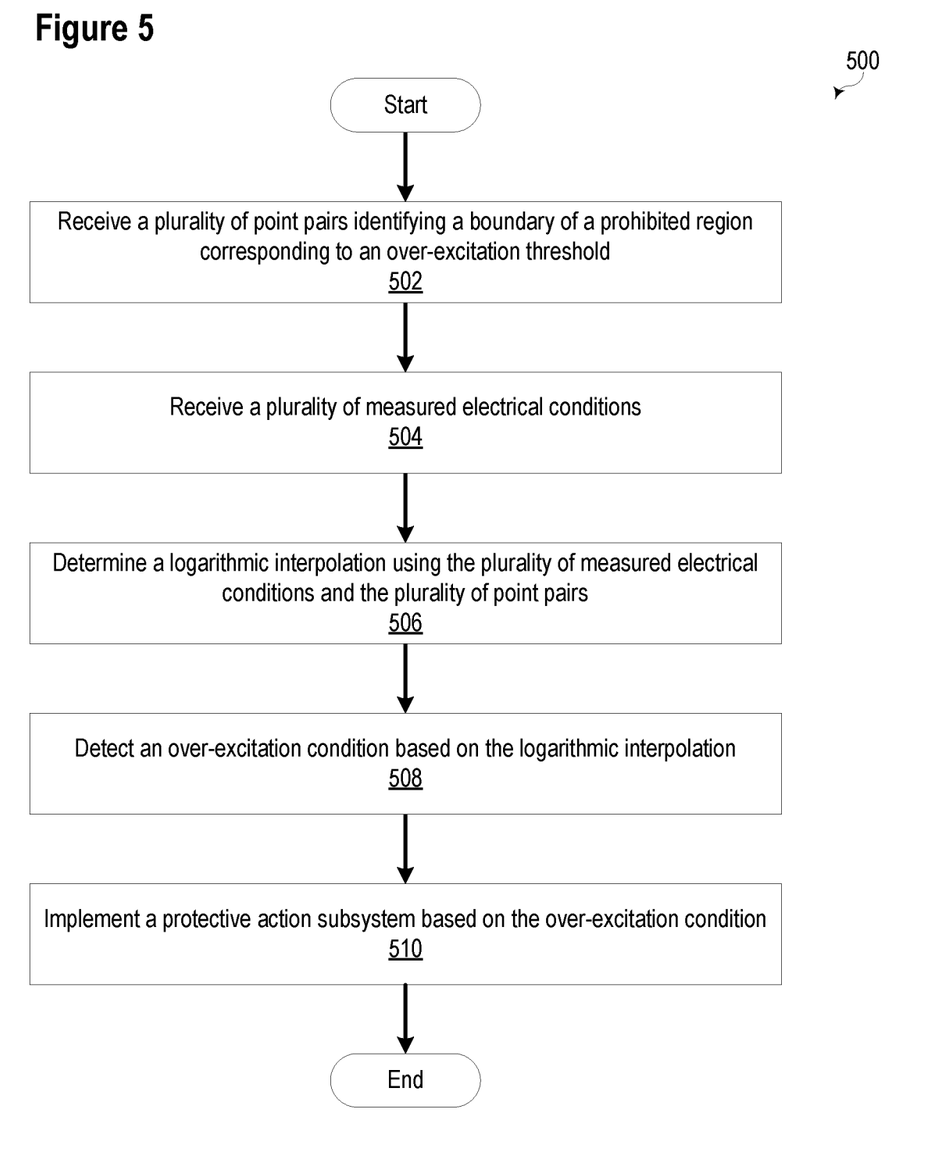
FIG. 5 illustrates a flow chart of a method for protecting equipment in an electric power system from over-excitation consistent with embodiments of the present disclosure.

FIG. 5 illustrates a flow chart of a method 500 for protecting equipment in an electric power system from over-excitation consistent with embodiments of the present disclosure. At 502, a user may input a plurality of point pairs identifying a boundary of a prohibited region corresponding to an over-excitation threshold. In various embodiments, the input may comprise multiple point pairs defining a piecewise function.

At 504, a plurality of measured electrical conditions may be received. In some embodiments, the plurality of measured electrical conditions may be received from a sensor component associated with a protective relay or IED implementing method 400. In other embodiments, the plurality of measurements may be received via a communication interface from another device that received the measurements.

At 506, a logarithmic interpolation is determined using the plurality of measured electrical conditions and the plurality of point pairs. In various embodiments, the interpolation may be determined using Eq. 3, Eq. 4, and point pairs bounding the plurality of measured electrical conditions. Where the plurality of point pairs define a piecewise function, the portion of the piecewise function corresponding to a measured electrical condition may be used. Alternative approaches such as use of Eq. 6, Eq. 7, and point pairs bounding the plurality of measured electrical conditions may be used.

At 508, an over-excitation condition may be detected based on the logarithmic interpolation. The logarithmic interpolation may be compared to the over-excitation curve for a specific piece of monitored equipment to determine whether the piece of monitored equipment is operating in a prohibited region.

At 510, a protective action may be implemented based on the over-excitation condition. In various embodiments, the protective action may comprise adjusting an excitation. Protective actions may include reducing an excitation, shutting down the monitored equipment, electrically isolating the monitored equipment, or making other adjustments to monitored equipment to address an over-excitation condition. In some embodiments, an operating time may be calculated based on the plurality of measurements before implementing the protective action. A protective action may be delayed until the operating time has elapsed before implementing the protective action. During the operating time, the over-excitation condition may be remedied, thus rendering the protective action unnecessary. In various embodiments, Eq. 4 may be used to calculate an operating time.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. An over-excitation mitigation system, comprising:
   a point pair subsystem to receive a plurality of point pairs that define an over-excitation curve for a piece of monitored equipment;

an interface to receive a plurality of measurements corresponding to electrical conditions associated with the piece of monitored equipment;

a logarithmic interpolation subsystem to determine a logarithmic interpolation corresponding to one of the plurality of measurements based on the plurality of point pairs;

an over-excitation detection subsystem to detect an over-excitation condition based on the logarithmic interpolation; and a protective action subsystem to implement a protective action based on the over-excitation condition.

2. The system of claim 1, further comprising a sensor subsystem to measure electrical conditions associated with the piece of monitored equipment, and wherein the interface to receive the plurality of measurements comprises the sensor subsystem.

3. The system of claim 1, wherein the piece of monitored equipment comprises a generator.

4. The system of claim 1, wherein the piece of monitored equipment comprises a transformer.

5. The system of claim 1, wherein the plurality of point pairs defines a piecewise function.

6. The system of claim 1, wherein the point pair subsystem is configured to receive the plurality of point pairs in a base-10 representation.

7. The system of claim 6, wherein the point pair subsystem uses a Taylor series expansion to represent the base-10 representation.

8. The system of claim 1, wherein the over-excitation detection subsystem is configured to determine an operating time to elapse based on a plurality of measurements before the protective action subsystem implements the protective action.

9. The system of claim 8, wherein the over-excitation detection subsystem is configured to calculate the operating time, t, based on two point pairs, (VHz$_1$, t$_1$) and (VHz$_2$, t$_2$) and a measured value, VHz, that lies between the two point pairs VHz$_1$ and VHz$_2$ as:

$$\text{Slope} = \frac{V\text{Hz}_1 - V\text{Hz}_2}{10 \cdot \log_{10}\left(\frac{t_2}{t_1}\right)}, \text{ and}$$

$$t = t_1 \cdot 10^{\left(\frac{V\text{Hz}_1 - V\text{Hz}}{\text{Slope}*10}\right)}.$$

10. The system of claim 8, wherein the over-excitation detection subsystem is configured to calculate the operating time operating time, t, based on two point pairs, (VHz$_1$, t$_1$) and (VHz$_2$, t$_2$), and a measured value, VHz, that lies between the two point pairs VHz$_1$ and VHz$_2$ as:

$$f = \frac{V\text{Hz} - V\text{Hz}_1}{V\text{Hz}_2 - V\text{Hz}_1}, \text{ and } t = t_2^f \cdot t_1^{(1-f)}$$

11. The system of claim 1, further comprising a user interface subsystem to receive the plurality of point pairs from a user; and wherein the point pair subsystem receives the plurality of point pairs from the user interface subsystem.

12. A method for mitigating over-excitation, the method comprising:

receiving a plurality of point pairs that define an over-excitation curve for a piece of monitored equipment;

receiving a plurality of measurements corresponding to electrical conditions associated with the piece of monitored equipment;

determining a logarithmic interpolation corresponding to one of the plurality of measurements based on the plurality of point pairs;

detecting an over-excitation condition based on the logarithmic interpolation; and implementing a protective action based on the over-excitation condition.

13. The method of claim 12, wherein receiving the plurality of measurements comprises receiving the plurality of measurements from a sensor subsystem.

14. The method of claim 12, wherein the piece of monitored equipment comprises a generator.

15. The method of claim 12, wherein the piece of monitored equipment comprises a transformer.

16. The method of claim 12, wherein the plurality of point pairs defines a piecewise function.

17. The method of claim 12, further comprising receiving the plurality of point pairs in a base-10 representation.

18. The method of claim 17, further comprising using a Taylor series expansion to represent the base-10 representation.

19. The method of claim 12, further comprising calculating an operating time to elapse based on the plurality of measurements before implementing the protective action.

20. The method of claim 12, further comprising calculating the operating time, t, based on two point pairs, (VHz$_1$, t$_1$) and (VHz$_2$, t$_2$) and a measured value, VHz, that lies between the two point pairs VHz$_1$ and VHz$_2$ as:

$$\text{Slope} = \frac{V\text{Hz}_1 - V\text{Hz}_2}{10 \cdot \log_{10}\left(\frac{t_2}{t_1}\right)}, \text{ and}$$

$$t = t_1 \cdot 10^{\left(\frac{V\text{Hz}_1 - V\text{Hz}}{\text{Slope}*10}\right)}.$$

21. The method of claim 12, further comprising calculating the operating time, t, based on two point pairs, (VHz$_1$, t$_1$) and (VHz$_2$, t$_2$), and a measured value, VHz, that lies between the two point pairs VHz$_1$ and VHz$_2$ as:

$$f = \frac{V\text{Hz} - V\text{Hz}_1}{V\text{Hz}_2 - V\text{Hz}_1}, \text{ and } t = t_2^f \cdot t_1^{(1-f)}$$

22. The method of claim 12, further comprising receiving the plurality of point pairs from a user via a user interface.

* * * * *